(12) United States Patent
Morgan

(10) Patent No.: US 6,180,525 B1
(45) Date of Patent: Jan. 30, 2001

(54) METHOD OF MINIMIZING REPETITIVE CHEMICAL-MECHANICAL POLISHING SCRATCH MARKS AND OF PROCESSING A SEMICONDUCTOR WAFER OUTER SURFACE

(75) Inventor: Rod Morgan, Eagle, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/136,878

(22) Filed: Aug. 19, 1998

(51) Int. Cl.⁷ .................. H01L 21/302; H01L 21/461
(52) U.S. Cl. .......................................................... 438/692
(58) Field of Search .................................... 438/692, 691, 438/690, 424, 427

(56) References Cited

U.S. PATENT DOCUMENTS

| | | | |
|---|---|---|---|
| 5,494,854 | * 2/1996 | Jain | 437/195 |
| 5,498,565 | * 3/1996 | Gocho et al. | 437/67 |
| 5,580,826 | * 12/1996 | Matsubara et al. | 437/195 |
| 5,665,202 | * 9/1997 | Subramanian et al. | 438/692 |
| 5,728,621 | * 3/1998 | Zheng et al. | 438/427 |
| 5,750,433 | * 5/1998 | Jo | 438/424 |
| 5,854,133 | * 12/1998 | Hachiya et al. | 438/692 |
| 5,872,058 | * 2/1999 | Van Cleemput et al. | 438/692 |
| 5,885,900 | * 3/1999 | Schwartz | 438/697 |
| 5,923,993 | * 7/1999 | Sahota | 438/427 |
| 5,990,558 | * 11/1999 | Tran | 257/759 |

* cited by examiner

Primary Examiner—Benjamin L. Utech
Assistant Examiner—Matt Anderson
(74) Attorney, Agent, or Firm—Wells, St. John, Roberts, Gregory & Matkin

(57) ABSTRACT

A method of minimizing repetitive chemical-mechanical polishing scratch marks from occurring on a polished semiconductor wafer surface resulting from breaking away of surface peaks having an elevation of at least 400 nanometers above an outer surface immediately adjacent said peaks comprises improving adherence of said peaks to the wafer by filling at least a portion of the volume between adjacent peaks with a material and chemical-mechanical polishing the peaks and the material at the same time. A method of minimizing undesired node-to-node shorts of a length less than or equal to 0.3 micron formed laterally along an insulating dielectric layer in a monolithic integrated circuit chip comprises depositing a sacrificial layer of material over the dielectric layer and chemical-mechanical polishing completely through the sacrificial layer and into the dielectric layer prior to depositing any metal over the insulating dielectric layer. A semiconductor processing method comprises observing repetitive scratch marks on a chemical-mechanical polished surface of a first material on a first semiconductor wafer in process. On a plurality of semiconductor wafers processed subsequently to the first, a second material is formed over the first material and chemical-mechanical polishing the first and the second materials at the same time and reducing occurrence of said scratch marks at least partially thereby, the second material being different from the first.

33 Claims, 4 Drawing Sheets

METHOD OF MINIMIZING REPETITIVE CHEMICAL-MECHANICAL POLISHING SCRATCH MARKS AND OF PROCESSING A SEMICONDUCTOR WAFER OUTER SURFACE

TECHNICAL FIELD

This invention relates to methods of minimizing repetitive chemical-mechanical polishing scratch marks, to methods of processing a semiconductor wafer outer surface, to methods of minimizing undesired node-to-node shorts of a length less than or equal to 0.3 micron, and to semiconductor processing methods.

BACKGROUND OF THE INVENTION

Chemical-mechanical polishing is one technique utilized to process the outer surface of various layers formed over a semiconductor wafer. One principal use of chemical-mechanical polishing is to render an outer wafer surface of a layer or layers to be more planar than existed prior to starting the polishing. Only some or all of the outermost layer being polished might be removed during such a process.

In chemical-mechanical polishing, both the wafer and the pad which polishes the wafer are typically caused to rotate, typically in opposite directions, during the polishing action. A liquid slurry is received intermediate the wafer and the polishing pad. The slurry comprises a liquid solution, typically basic, and a solid grit material, typically constituting particles of a consistent size (i.e., within 5 nanometers of a size selected from around 25 to 100 nanometers in diameter). The action of the liquid solution and grit within the slurry intermediate the wafer and pad imparts removal of outer wafer layers utilizing both chemical and mechanical actions.

Semiconductor wafer processing continues to strive for ever increasing miniaturization and circuit density. Consequently, the separation distance between circuit components needing to be electrically isolated continues to shrink. For example, fabrication of integrated circuitry typically involves forming electrically isolated active areas from the semiconductive material of the wafer. The isolation is achieved by forming insulating isolation regions between discrete active areas. The isolation regions are typically formed from an oxide material which is either grown or deposited over the wafer. In the recent past, a technique referred to as shallow trench isolation has emerged as one way of providing isolation regions for the ever decreasing geometries. Here, a series of shallow trenches (i.e., one micron or less in depth) are formed within a substrate by patterning and etching. The trenches are subsequently filled with an oxide material, most typically deposited by a high density plasma deposition. The oxide is subsequently planarized by chemical-mechanical polishing, for example as described above. This forms discrete active area regions separated by isolation oxide.

As the separation between active areas fell to and below 0.3 micron, ever increasing and unacceptable circuit failures were discovered. This of course reduces yield and accordingly requires discarding of an increasing volume of potentially salable product.

SUMMARY OF THE INVENTION

In but one aspect of the invention, a method of minimizing repetitive chemical-mechanical polishing scratch marks from occurring on a polished semiconductor wafer surface resulting from breaking away of surface peaks having an elevation of at least 400 nanometers above an outer surface immediately adjacent said peaks comprises improving adherence of said peaks to the wafer by filling at least a portion of the volume between adjacent peaks with a material and chemical-mechanical polishing the peaks and the material at the same time.

In another aspect, a method of minimizing undesired node-to-node shorts of a length less than or equal to 0.3 micron formed laterally along an insulating dielectric layer in a monolithic integrated circuit chip comprises depositing a sacrificial layer of material over the dielectric layer and chemical-mechanical polishing completely through the sacrificial layer and into the dielectric layer prior to depositing any metal over the insulating dielectric layer.

In but another aspect, a semiconductor processing method comprises observing repetitive scratch marks on a chemical-mechanical polished surface of a first material on a first semiconductor wafer in process. On a plurality of semiconductor wafers processed subsequently to the first, a second material is formed over the first material and chemical-mechanical polishing the first and the second materials at the same time and reducing occurrence of said scratch marks at least partially thereby, the second material being different from the first.

These and other aspects are described below.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Recently available low grazing angle laser inspection tools have enabled a determination of the number and location of node-to-node short circuit defects that apparently were causing the circuit failures described above where separation between active areas fell to and below 0.3 micron. From such, it became more easily possible to quickly focus on specific areas of the defective circuitry utilizing scanning electron micrographs in a reverse engineering manner to determine the cause of the defects. One significant cause found was the creation of repetitive scratch marks or chatter marks which were somehow occurring during chemical-mechanical polishing of insulating dielectric layers, such as the high density plasma-deposited oxide which fills isolation trenches. Apparently, at least the isolation oxide between active areas was being repetitively scratched, effectively creating surface paths laterally between the active areas. This was ultimately resulting in conductive stringers being formed along these paths upon subsequent deposition and patterning of conductive layers.

Figure 1:
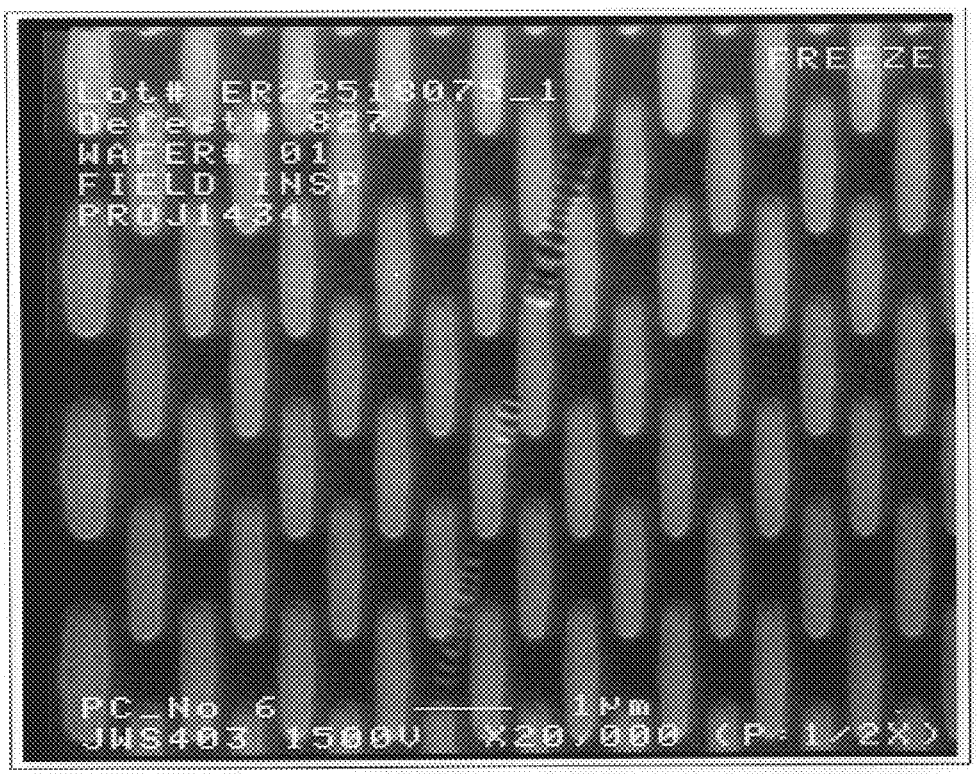
FIG. 1 is a scanning electron micrograph of a semiconductor wafer fragment.

Specifically and initially with reference to FIG. 1, a semiconductor wafer fragment in process is shown generally at 8 and includes a semiconductive substrate. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The illustrated ovals or ellipses constitute active area with the surrounding material constituting trenched isolation oxide after chemical-mechanical processing has been conducted. Repetitive scratch marks can be seen in the illustrated field of view as formed on the outer surface within the isolation oxide due to the chemical-mechanical polishing. Such scratches have been determined to individually typically comprise a length from 250 nanometers to 1500 nanometers and a depth of from 20 nanometers to 1000 nanometers. Such individual marks are typically spaced from one another anywhere from 10% to 50% of their lengths. Conductive material deposited within these scratch marks is not always completely removed, thereby leaving fatal conductive stringer shorts between discrete active areas. One mechanism by which such marks are created has been discovered, and a method developed for reducing occurrence of the same.

Figure 2:
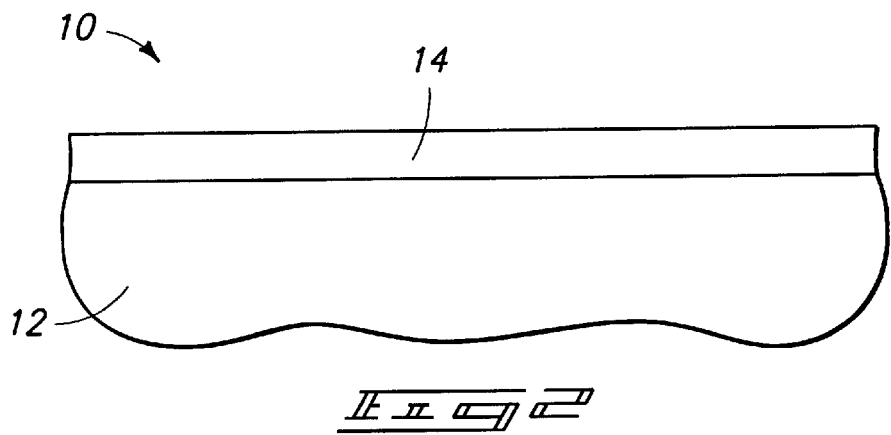
FIG. 2 is a diagrammatic side sectional view of a semiconductor wafer fragment in process in accordance with one or more embodiments of the invention.

Referring to FIG. 2, a wafer fragment 10 comprises a semiconductive substrate 12 having a mask layer 14 formed thereover. An exemplary material is photoresist.

Figure 3:
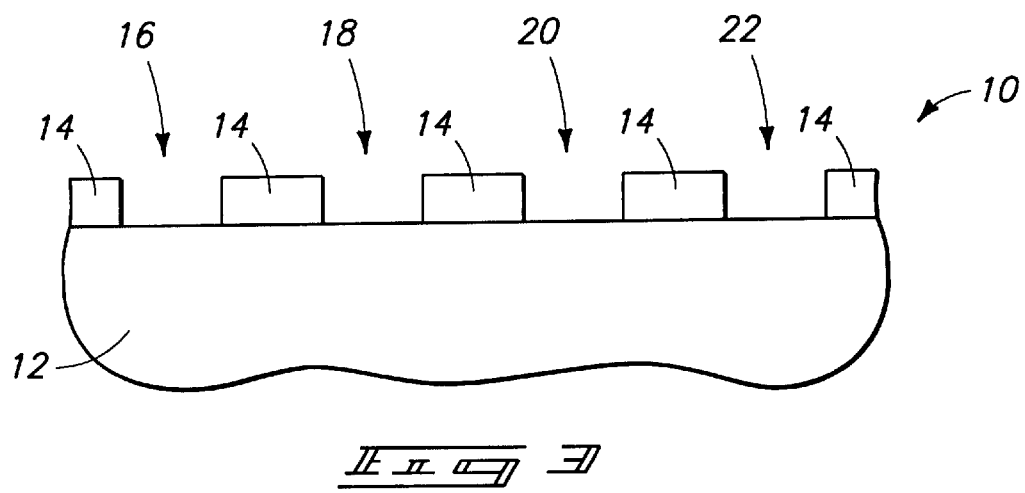
FIG. 3 is a view of the FIG. 2 wafer fragment at a processing step subsequent to that shown in FIG. 1.

Referring to FIG. 3, masking layer 14 is patterned to define a series of trench patterns 16, 18, 20, and 22.

Figure 4:
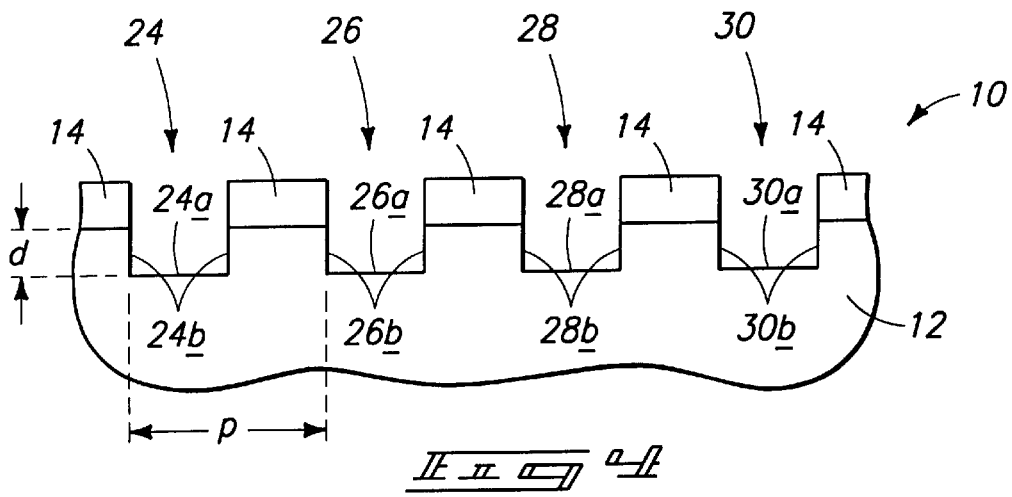
FIG. 4 is a view of the FIG. 2 wafer fragment at a processing step subsequent to that shown in FIG. 3.

Referring to FIG. 4, a series of trenches 24, 26, 28 and 30 are formed within or received by substrate 12 by etching the trenches into the substrate. The trenches have individual bases 24a, 26a, 28a, and 30a, respectively, and individual sidewalls 24b, 26b, 28b, and 30b, respectively, joined therewith. An example depth for the trenches is 1 micron or less. Additionally, an example pitch "p" which defines, in part, a spacing dimension between adjacent trenches is 250 nanometers to 1000 nanometers.

Figure 5:
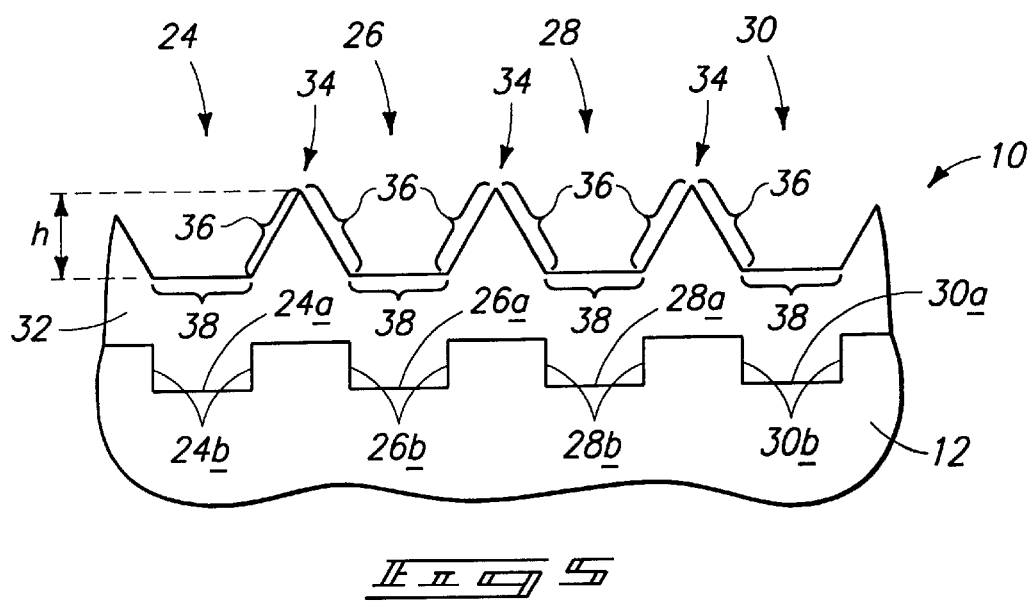
FIG. 5 is a view of the FIG. 2 wafer fragment at a processing step subsequent to that shown in FIG. 4.

Referring to FIG. 5, trenches 24, 26, 28 and 30 are filled with an isolation material layer 32, which produces a nonplanar outer surface. In a preferred embodiment, isolation material layer 32 comprises a layer of high density plasma-deposited oxide. The term "high density" as used in this document means a deposition plasma having a density of greater than $10^{10}$ ions/cm$^3$. It has been discovered that the outer surface of the deposited oxide comprises surface peaks 34 having an elevational rise "h" of 400 nanometers or greater above an outer surface 38 immediately adjacent such peaks. Further, peaks 34 have sidewalls 36 which are not vertical. It has also been discovered that these peaks have a tendency to break away during chemical-mechanical polishing of layer 32. Thus, layer 32 constitutes but one example of a semiconductor wafer outer surface prone to breaking off of particles of a size greater than or equal to about 400 nanometers in minimum diameter dimensions during chemical-mechanical polishing. The existence of these particles, which are considerably larger than the grit inherently provided in the CMP slurry, has been discovered to form these repetitive scratch or chatter marks. In the embodiment shown and described, such ultimately can result in undesired node-to-node shorts having a total length less than or equal to 0.3 micron formed laterally along insulating dielectric layer 32 in a resultant monolithic integrated circuit chip.

Figure 6:
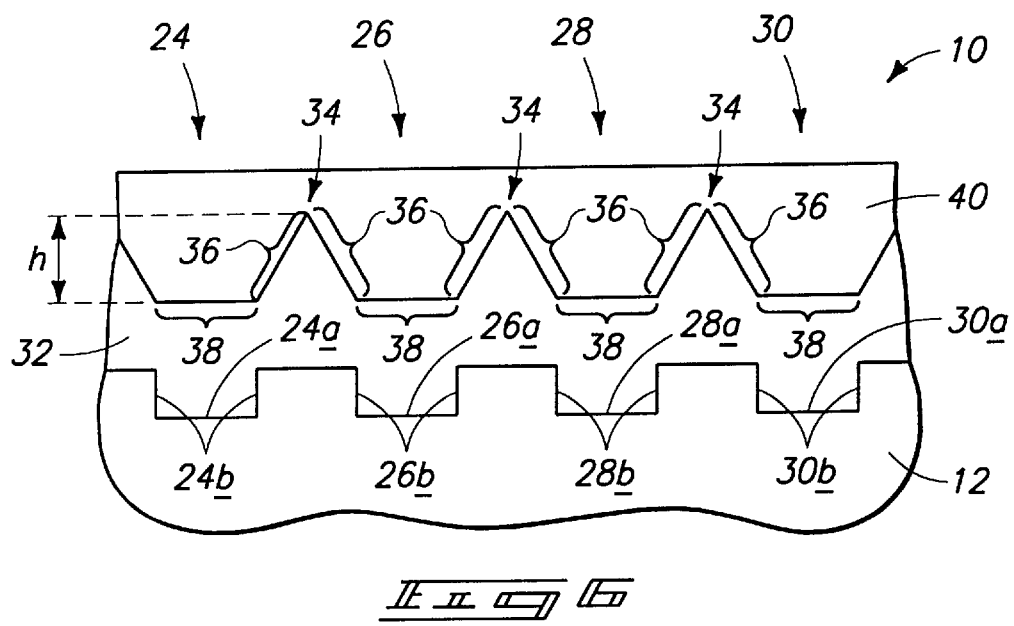
FIG. 6 is a view of the FIG. 2 wafer fragment at a processing step subsequent to that shown in FIG. 5.

In accordance with one aspect of the invention, adherence of peaks 34 to the wafer is improved by filling at least a portion of the volume between adjacent peaks with a material, and chemical-mechanical polishing the peaks and the material at the same time. FIG. 6 illustrates a layer 40 of filling material formed, for example, by deposition to a thickness equal to about 1.5 times the elevation "h", and accordingly is to a thickness greater than such elevation. Accordingly, filling material 40 covers outer surface 38 and over said peaks 34. Alternately, the filling material can be deposited to a thickness less than elevation "h", such as to about one-half of said elevation. A thinner layer 40 might also be provided, but is less preferred in perhaps not providing adequate support for peaks 34 during the subsequent polishing, as will be explained below. More preferably, the filling material fills at least one-half of the volume between adjacent peaks, which would be to a deposition thickness slightly greater than elevation "h" due to the non-vertical nature of peak sidewalls 36 in the described preferred embodiment. Example preferred filling materials are different from layer 32, and include doped or undoped oxides, polymer materials such as photoresist, various nitrides and other materials substantially void of oxide. Alternately, layer 40 can comprise the same material as that which comprises layer 32.

Figure 7:
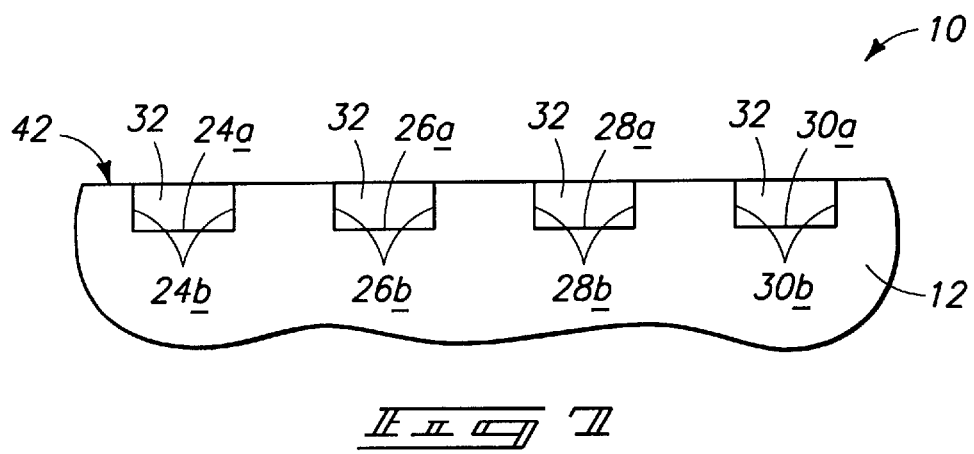
FIG. 7 is a view of the FIG. 2 wafer fragment at a processing step subsequent to that shown in FIG. 6.

Referring to FIG. 7, the outermost surface of filling layer 40 is chemical-mechanical polished to initially remove material from over peaks 34, whereupon continued chemical-mechanical polishing action polishes peaks 34 and material 40 at the same time. Adherence of peaks 34 upon continued polishing relative to wafer 10 is improved by the adjacent presence of material 40 making it difficult for peaks 34 to break away relative to or from beneath their adjacent outer surfaces 38. As shown in FIG. 7 in the one described embodiment, the chemical-mechanical polishing continues to completely remove peaks 34 and through outer surface 38 until layer 40 is completely removed from the wafer. Thus in this embodiment, layer 40 constitutes a sacrificial layer completely removed from the wafer, and whereby shallow trench isolation regions 32 are formed intermediate desired active area regions. Such processing has been found to significantly minimize undesired node-to-node shorts of a length less than or equal to 0.3 micron formed laterally along insulating dielectric layer 32 where conducted prior to depositing any metal over insulating dielectric layer 32. While developed in the context of this environment, the invention is believed to have applicability in other than shallow trench isolation, high density plasma-deposited oxide polishing and sacrificial layer formation, with the invention only being limited by the accompanying claims appropriately interpreted in accordance with the Doctrine of Equivalents.

In another aspect, the invention might be considered as a semiconductor processing method whereby repetitive scratch marks on a chemical-mechanical polished surface of a first material on a first semiconductor wafer in process are observed. On a plurality of semiconductor wafers processed subsequently to the first, a second material preferably different from the first is formed over the first material, with the first and second materials being chemical-mechanical polished at the same time and reducing occurrence of the scratch marks at least partially thereby. In other words, an aspect of the invention contemplates observation of such marks on at least one wafer processed earlier in time and modifying the process in accordance with a second formed material and polishing the first and second materials at the same time. The subsequent processed wafers can have the same or different circuitry as the first wafer, and the second material may be the same for all wafers of the plurality or different for at least some of the plurality. Preferably, such processing can result in complete elimination of occurrence of the scratch marks on most, if not all, of the subsequently processed wafers for years. Scratch or chatter marks might occur by other means too, with this being discovered to be one principal source which can be reduced by practice of methods in accordance with the invention as described and claimed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of minimizing repetitive chemical-mechanical polishing scratch marks from occurring on a polished semiconductor wafer surface resulting from breaking away of surface peaks having an elevation of at least 400 nanometers above an outer surface immediately adjacent said peaks comprising improving adherence of said peaks to the wafer by filling at least a portion of the volume between adjacent peaks with a material and chemical-mechanical polishing the peaks and the material at the same time.

2. The method of claim 1 comprising filling at least one-half of the volume between adjacent peaks with the material.

3. The method of claim 1 comprising filling no more than about one-half of the volume between adjacent peaks with the material.

4. The method of claim 1 wherein the filling comprises depositing said material to a thickness greater than or equal to about one-half the elevation.

5. The method of claim 1 wherein the filling comprises depositing said material to a thickness equal to about one-half the elevation.

6. The method of claim 1 wherein the filling comprises depositing said material to a thickness less than the elevation.

7. The method of claim 1 wherein the filling comprises depositing said material to a thickness greater than the elevation.

8. The method of claim 1 wherein the filling comprises depositing said material to a thickness equal to about 1.5 times the elevation.

9. The method of claim 1 wherein at least a majority of said peaks have sidewalls which are not vertical.

10. The method of claim 1 wherein said peaks comprise high density plasma-deposited oxide.

11. The method of claim 1 wherein the chemical-mechanical polishing comprises polishing through the outer surface.

12. The method of claim 1 wherein the chemical-mechanical polishing comprises polishing all of the material away from the wafer.

13. The method of claim 1 wherein the filling material covers said outer surface and over said peaks, the chemical-mechanical polishing initially removing the material from over the peaks.

14. The method of claim 1 wherein the filling material comprises photoresist.

15. The method of claim 1 wherein the filling material is substantially void of oxide material.

16. A method of processing a semiconductor wafer outer surface prone to breaking off of particles of a size greater than or equal to about 400 nanometers in diameter during chemical-mechanical polishing comprising depositing a sacrificial layer over said outer surface and chemical-mechanical polishing the sacrificial layer and through said outer surface until said layer is completely removed from the wafer.

17. The method of claim 16 wherein the outer surface comprises high density plasma-deposited oxide.

18. The method of claim 16 wherein the sacrificial layer is deposited to a thickness less than 400 nanometers.

19. The method of claim 16 wherein the sacrificial layer is deposited to a thickness greater than 400 nanometers.

20. The method of claim 16 wherein the sacrificial layer is deposited to a thickness of 400 nanometers.

21. The method of claim 16 wherein the sacrificial layer comprises photoresist.

22. The method of claim 16 wherein the sacrificial layer is substantially void of oxide material.

23. A method of minimizing undesired node-to-node shorts of a length less than or equal to 0.3 micron formed laterally along an insulating dielectric layer in a monolithic integrated circuit chip comprising depositing a sacrificial layer of material over the dielectric layer and chemical-mechanical polishing completely through the sacrificial layer and into the dielectric layer prior to depositing any metal over the insulating dielectric layer.

24. The method of claim 23 wherein the node-to-node shorts comprise active area to active area shorts through shallow trench isolation material.

25. The method of claim 23 wherein the insulating dielectric layer comprises an oxide material and the sacrificial layer is substantially void of oxide.

26. The method of claim 23 wherein the sacrificial layer comprises photoresist.

27. The method of claim 23 wherein the insulating dielectric layer comprises high density plasma-deposited oxide.

28. A semiconductor processing method comprising:
observing repetitive scratch marks on a chemical-mechanical polished surface of a first material on a first semiconductor wafer in process; and
on a plurality of semiconductor wafers processed subsequently to the first, forming a second material over the first material and chemical-mechanical polishing the first and the second materials at the same time and reducing occurrence of said scratch marks at least partially thereby, the second material being different from the first.

29. The method of claim 28 wherein the plurality are processed to have the same circuitry as the first wafer.

30. The method of claim 28 wherein the second material is the same for all of the plurality.

31. The method of claim 28 wherein the second material is different for at least some of the plurality.

32. The method of claim 28 comprising eliminating occurrence of said scratch marks thereby on a majority of said plurality.

33. The method of claim 28 wherein the first material comprises surface peaks having an elevation of at least 400 nanometers above an outer surface of said first material immediately adjacent said peaks and breaking away of said peaks at least contributing to the formation of said scratch marks, the second material being deposited over said peaks and said outer surface, and chemical-mechanical polishing the peaks and the second material at the same time on individual wafers of the plurality.

* * * * *